United States Patent [19]

Dehaine

[11] Patent Number: 5,010,949
[45] Date of Patent: Apr. 30, 1991

[54] DEVICE FOR FASTENING TOGETHER UNDER PRESSURE TWO PIECES, ONE TO THE OTHER

[75] Inventor: Gérard Dehaine, Chatillon, France

[73] Assignee: Bull, S.A., Paris, France

[21] Appl. No.: 325,763

[22] Filed: Mar. 20, 1989

[30] Foreign Application Priority Data

Mar. 22, 1988 [FR] France .................. 88 03675

[51] Int. Cl.⁵ .................. F28F 7/00; H01L 23/40
[52] U.S. Cl. .................. 165/76; 165/185; 165/80.3; 361/386; 403/404; 411/909
[58] Field of Search .................. 165/32, 76, 185, 80.3; 361/386; 411/909; 403/404

[56] References Cited

FOREIGN PATENT DOCUMENTS

| | | | |
|---|---|---|---|
| 2306783 | 11/1976 | France . | |
| 2326040 | 4/1977 | France . | |
| 203111 | 12/1982 | Japan | 165/32 |
| 225548 | 12/1984 | Japan | 165/32 |
| 114834 | 3/1985 | U.S.S.R. | 165/32 |

Primary Examiner—Albert W. Davis, Jr.
Attorney, Agent, or Firm—Wolf, Greenfield & Sacks

[57] ABSTRACT

A heat sink of a circuit package for high density integrated circuits is fastened by a spring element that has shape memory. The fastening is carried out in a manner so that the element can be easily removed for disassembly.

32 Claims, 1 Drawing Sheet

DEVICE FOR FASTENING TOGETHER UNDER PRESSURE TWO PIECES, ONE TO THE OTHER

The invention concerns a device for fastening together under pressure two pieces, one to the other and particularly a detachable device for fastening under pressure two pieces of an electronic assembly such as a high density integrated circuit package.

BACKGROUND OF THE INVENTION

A device for fastening two pieces together under pressure includes a spring pressure device which has the advantage of apply a predetermined pressure that is essentially constant on the two pieces, and a connection device. For fastening the two pieces, it is necessary to assemble them correctly with the pressure device and the connection device in such a way that the pressure device can be compressed to exert the desired forces. It is understood that placement of the pressure device is especially difficult because the pieces are of small dimensions and the fastening pressure is elevated. In addition it is sometimes desirable that the fastener be removable. Clearly, the disassembly of a pressure fastening device causes the same difficulties as assembly does. Another difficulty is added when one of the pieces is subjected to conditions that can cause the fastening device to change states. For example, exposure to heat of at least one of the pieces can deform or corrode certain parts of the fastening device and make disassembly difficult. The removable pressure fastener of a heat sink on a high density integrated circuit package includes these difficulties and thus will be used as an example to illustrate the invention.

In effect while the size of integrated circuits does not stop increasing and is actually over one centimeter on a side the packages are designed to become smaller and smaller For example, in the packages such as those described in French patent applications No. 87 13416 and 87 13417 of the applicant, the inner plate for drawing off heat is two to three times as large as that of the integrated circuit, which would be about 25 mm on a side. Fastening the heat sink is usually done on a lateral column of the plate. Various forms that permit removal have already been considered, notably gluing and screwing.

However, the glue adds thermal resistance to the heat evacuation path and gluing is a delicate operation. As to screwing, it is difficult with such small pieces and causes difficulty and higher costs for the uniform pressure contact required of the heat sink against the liner plate of the circuit package. In addition, heating the two pieces may make unfastening difficult after a certain period of time. A pressure fastening device could be advantageous to assure uniform contact at a predetermined pressure of the heat sink against the box inner plate, but it has previously been seen that a fastening device of this type simultaneously complicates the structure and the operations of assembly and disassembly.

Another approach for cooling integrated circuits consists of applying one and the same heat sink on a group of integrated circuits mounted on a printed circuit card. The heat sink is still fixed on the solid posts of the card in such a way that it can be removed. It is also desirable in this case to have simple and efficient fastening devices which remain easily removable whatever the usage conditions of the pieces and their changes over time.

SUMMARY OF THE INVENTION

The subject of the invention is a device for fastening under pressure two pieces one to the other, having a simple structure and resulting in a fastener that is easily removable, independent of the usage conditions of the pieces or their changes over time.

According to the invention, a device for fastening under pressure of two pieces one to the other is characterized in that the pressure device includes a shape memory element.

The characteristics and advantages of the invention can be taken from the following description, given by way of example and done with reference to the attached drawing.

DESCRIPTION OF THE PREFERRED EMBODIMENT

Figure 1:
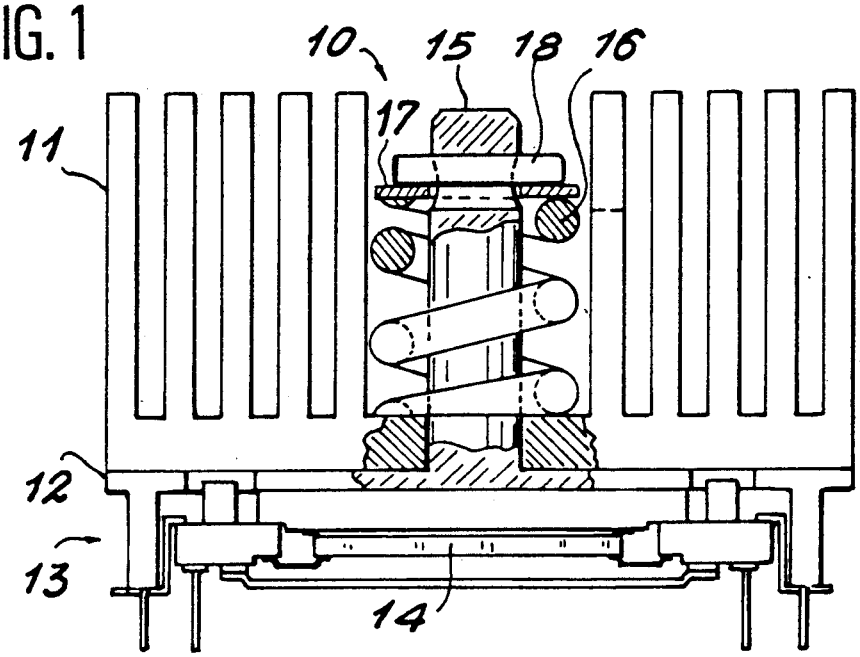
FIG. 1 is one cross sectional view of a fastening device conforming to the invention, which in its static state is fastening a heat sink to the internal plate of a high density integrated circuit package seen from the side and represented schematically.
Figure 2:
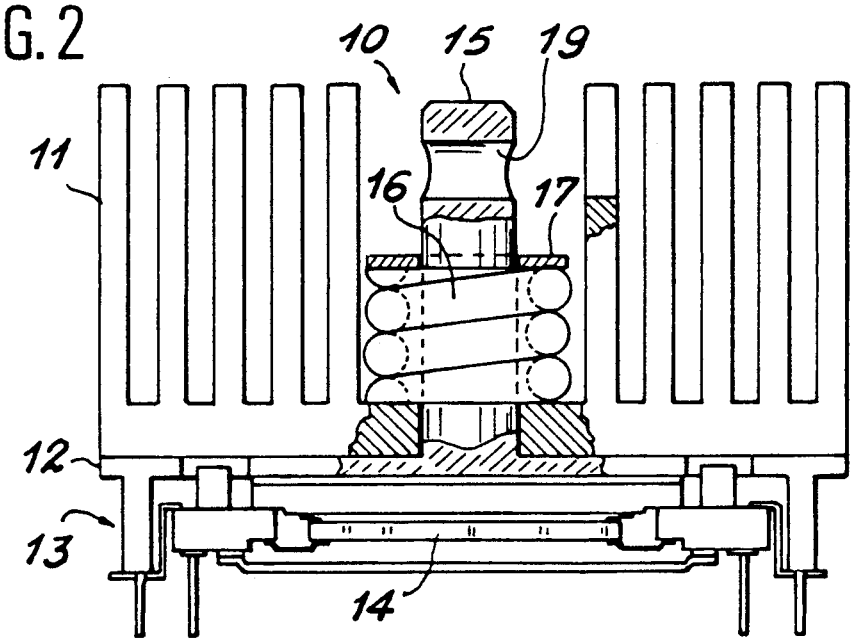
FIG. 2 is a view similar to FIG. 1, illustrating the fastening device in its favorable state during disconnection of the heat sink.

FIGS. 1 and 2 illustrate an example of the preferred implementation, conforming to the invention of a device 10 for fastening under pressure two pieces 11, 12, one to the other, consisting respectively of the heat sink 11 mounted on the inner plate 12 of a circuit package 13 for high density integrated circuits. The circuit package 13 illustrated corresponds to the one described in the aforementioned French patent Application No. 87 13417 of the applicant. According to this example, the plate 12 serves simultaneously to support the integrated circuit 14 and as a discharge element for the heat generated by the integrated circuit. Piece 12 is, for example, a large plate with a copper base approximately 25 mm on a side. The plate 12 is equipped with a lateral column 15 for fastening the fin heat sink 11. The pressure fastening device 10 includes a pressure device 16 having the form of a helical spring and a detachable connection device consisting of a ring 17, a pin 18 and a hole 19 in column 15 for pin 18. In the example described, column 15 was 5 mm in diameter and spring 16 was a 3 mm diameter wire wound in three spirals having a diameter of at least 11 mm and exerting, in the working position illustrated in FIG. 1, a pressure P=150 Newtons on the base of the heat sink 11 against the plate 12 for an extension of about 20 mm.

Figure 3A:
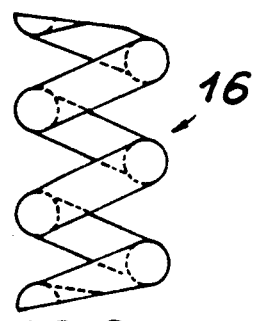
FIGS. 3A, 3B and 3C illustrating various states of the shape memory spring illustrated in FIGS. 1 and 2.
Figure 3B:
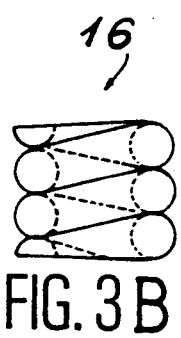
Figure 3C:
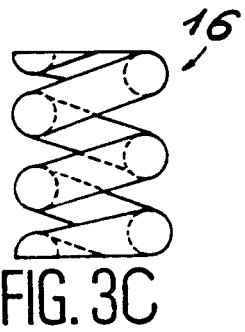

According to the invention the spring 16 is made of a material with shape memory. FIGS. 3A, 3B and 3C illustrate the characteristics of spring 16 used for fastening device 10 In this example, spring 16 has a titanium and nickel base. FIG. 3A illustrates the spring in its stable state liberally FIG. 3B illustrates spring 16 retracted, in its martensitic shape memory. FIG. 3B illustrates spring 16 retracted, in its martensitic phase. The material chosen had an Ms transition temperature of 213 K. In other words, the state of spring 16 illustrated in FIG. 3B corresponds to a temperature lower than 213 K, while the liberally spread out state illustrated in FIG. 3A corresponds to a temperature above 213 K, and lower than 423 K, which is the maximum temperature to obtain shape memory. FIG. 3C illustrates the state of spring 16 compressed in its austenitic phase to exert the predetermined pressure when it is mounted in the fastening device 10 such as is represented in FIG. 1

The mounting and removal of heat sink 11 on circuit package 13 will now be illustrated with reference to FIGS. 1 to 3. With reference to FIG. 2, the heat sink 11 is disposed around column 15 until it comes in contact with plate 12 of circuit package 13. Spring 16, in its state represented in FIG. 3A, is then arranged coaxially to column 15. Spring 16 is then subjected to a temperature lower than its Ms transition temperature to bring it into its martensitic phase and obtain its retracted state such as is represented in FIG. 2 and 3B. The low temperature can be obtained, for example using a cryogenic aerosol spray which offers the advantage of ease of usage, transportation and manipulation. Ring 17 is placed on spring 16 and pin 18 is introduced into hole 19 of column 15. This introduction must naturally be done easily and without effort. Under the effect of ambient temperature the spring returns to its stable austenitic state and also takes the working position represented in FIGS. 1 and 3C. For disassembly, a cryogenic aerosol is applied to the spring 16 represented in FIG. 1, which will induce the martensitic phase represented in FIG. 2. In this way, pin 18 is easily removed before spring 16 returns to its austenitic state, which will give it the liberally spread out form represented in FIG. 3A.

This description suggests the obviousness of all the possible implementation variations of a removable pressure fastening device conforming to the invention. For example, pressure device 16 may be complex and use various pressure elements in different forms. It may be enough, according to its construction, that at least one of the pressure elements would be made of a material with shape memory. Taking into account the large variety of materials with shape memory, the pressure device may have another form than that illustrated and present the characteristics completely differently, although it fulfills a function similar to the one described On the other hand, the removable connection device may naturally be somewhat poor, provided that it permits release of pressure device 16 from its compressed state at the time the two pieces 11 and 12 are disassembled. In this way, ring 17 and pin 18 could be replaced by a retracting ring, for example.

I claim:

1. A device for dissipating heat from an integrated circuit, comprising a first piece coupled to said integrated circuit, a second piece having a surface and an opposite face, the surface adapted to thermally engage said first piece for enabling heat dissipation away from the integrated circuit, means for urging the first and second pieces together in thermal engagement, the means comprising a removable spring with shape memory, the spring extending between said opposite face of said second piece and a support means removably connected to said first piece.

2. A device according to claim 1, wherein said first piece comprises a plate means having the integrated circuit supported therein.

3. A device according to claim 2 wherein said second piece comprises a heat sink piece.

4. A device according to claim 3 wherein said heat sink piece has fins extending in a direction away from said plate means.

5. A device according to claim 1, wherein said spring with shape memory comprises a helical spring.

6. A device according to claim 5, wherein said support means comprises a removable surface at the end of a column disposed against said first piece and extending through a hole in the second piece, with said helical spring disposed about said column.

7. A device according to claim 6, wherein said removable surface includes a ring disposed at one end of the helical spring and a pin disposed over the helical spring and extending through a hole in the column.

8. A device according to claim 1, further comprising a means for cooling said spring to compress it and to permit securing of said support means by allowing the spring to expand to apply pressure between said pieces and to permit unsecuring of said support means by subsequently allowing the spring to cool.

9. A device according to claim 8, wherein said spring is constructed of a material having an austenitic phase prior to cooling and capable of changing to its martensitic phase upon cooling.

10. In a device for fastening together two pieces used with an integrated circuit, a method of fastening the two pieces together comprising the steps of, providing an element with shape memory and coupling the element between said pieces so as to apply pressure between the pieces to maintain the pieces in relative thermal engagement, said step of coupling including initially disposing the element between the pieces, cooling the element to compress the element, securing the element to at least one of said pieces and permitting the element to expand so as to apply pressure between the pieces to maintain the pieces in relative thermal engagement.

11. A method according to claim 10 including subsequently cooling the element to compress the element and permit unsecuring thereof.

12. A method according to claim 11 wherein said element is constructed of a material having an austenitic phase prior to cooling and changes to its martensitic phase upon cooling.

13. An arrangement comprising a first piece and a second piece having respective facing surfaces and opposite surfaces, and means for urging the first and second pieces together and comprising a spring with shape memory, extending between said opposite surface of the second piece and upper support means removably connected to said first piece to make the spring free of support and removable from the arrangement.

14. An arrangement according to claim 13, wherein said spring is a helical spring.

15. An arrangement according to claim 14, wherein said support means comprises a removable surface at the end of a column fixed to the first piece an extending through a hole in the second piece, with said helical spring disposed about the column.

16. An arrangement according to claim 15, wherein said removable surface includes a ring disposed at one end of the helical spring and a pin disposed over the helical spring and extending through a hole in the column.

17. An arrangement according to claim 13, wherein said spring is cooled to compress and to permit securing of said support means and is subsequently allowed to expand to apply pressure between said pieces.

18. An arrangement according to claim 17, wherein the spring is subsequently cooled to compress it and permit unsecuring of said support means.

19. An arrangement according to claim 18, wherein said spring is made of a material having an austenitic phase prior to cooling and changes to its martensitic phase upon cooling.

20. In a device for fastening together two pieces having facing surfaces and corresponding opposite surfaces, with one piece having removable support means over said opposite surface of the other piece, a method of fastening the two pieces together comprising the steps of removing said support means to allow passage of said spring, disposing the spring to be supported by said opposite surface of said other piece, cooling the spring to compress it, securing said support means to said one piece, and permitting the spring to expand so as to apply pressure between the pieces.

21. A method according to claim 20, including subsequently cooling the spring to compress it and unsecuring said support means, whereby the pieces are freely disengageable.

22. A method according to claim 20, wherein said spring is made of material having an austenitic phase prior to cooling and changes to its martensitic phase upon cooling.

23. A device for fastening together two pieces having facing surfaces and corresponding opposite surfaces, comprising:
   a support means removably connected to one of the first pieces;
   a spring with shape memory extending between the opposite surface of the other of the pieces and the support means, the spring capable of being removed from the support means.

24. A device according to claim 23, wherein said spring is a helical spring.

25. A device according to claim 24, wherein said support means comprises a removable surface at the end of a column disposed against the first piece and extending through a hole in the second piece, with said helical spring disposed about the column.

26. A device according to claim 25, wherein said removable surface includes a ring disposed at one end of the helical spring and a pin disposed over the helical spring and extending through a hole in the column.

27. A device according to claim 23, wherein said spring further comprising a means for cooling the spring to cause it to move from a first compressed position to a second expanded position.

28. A device according to claim 27, wherein the spring in its first compressed position permits unsecuring of the support means, and the spring in its second expanded position permits it to both apply pressure between the two pieces and to secure the support means.

29. A device according to claim 28, wherein said spring is made of a material having an austenitic phase prior to cooling and is capable of changing to its martensitic phase upon cooling.

30. A method for fastening together two pieces having facing surfaces and corresponding opposite surfaces, comprising the steps of:
   providing one of the pieces with a removable support means disposed against the opposite surface of the other piece;
   providing the support means with a spring having shape memory;
   disposing the spring against the opposite surface of the other of said pieces;
   cooling the spring to compress it;
   securing said support means to said one piece by permitting the spring to expand so as to apply pressure between the two pieces and maintain them in engagement.

31. A method according to claim 30, further comprising cooling the spring to compress it and unsecuring said support means, whereby the two pieces are freely disengageable.

32. A method according to claim 30, wherein said spring is made of material having an austenitic phase prior to cooling and is capable of changing to its martensitic phase upon cooling.

* * * * *